United States Patent [19]

Sada et al.

[11] 3,710,195

[45] Jan. 9, 1973

[54] PRINTED CIRCUIT BOARD HAVING A THERMALLY INSULATED RESISTOR

[75] Inventors: Tomohiko Sada; Noriyuki Tsuchiya; Tameo Amamiya; Yoko Kaneda; Kazuyuki Ohta, all of Tokyo, Japan

[73] Assignee: Sony Corporation, Tokyo, Japan

[22] Filed: Feb. 12, 1971

[21] Appl. No.: 114,960

[30] Foreign Application Priority Data

Feb. 14, 1970 Japan ................................45/12885

[52] U.S. Cl.................317/101 C, 174/68.5, 338/309

[51] Int. Cl................................................H02b 1/04

[58] Field of Search......174/68.5; 317/101 A, 101 C, 317/101 CC, 101 CM; 117/215, 212; 338/307–309, 252, 253

[56] References Cited

UNITED STATES PATENTS

| | | | |
|---|---|---|---|
| 3,303,078 | 2/1967 | Rubin | 174/68.5 X |
| 3,337,365 | 8/1967 | Mones | 338/308 X |
| 3,360,688 | 12/1967 | Triggs | 338/308 X |
| 3,381,081 | 4/1968 | Schalliol | 174/68.5 |

*Primary Examiner*—Bernard A. Gilheany
*Attorney*—Lewis H. Eslinger, Alvin Sinderbrand and Curtis, Morris & Safford

[57] ABSTRACT

A printed circuit board comprising a resistor on the surface that receives molten solder. The resistor has a heat shielding layer on it and may also have connections of low heat conductivity material to the conductive circuit on the board.

2 Claims, 14 Drawing Figures

INVENTORS
Tomohiko Sada Noriyuki Tsuchiya
Tameo Amamya, Yoko Kaneda and
BY Kazuyuki Ohta
Lewis H. Eslinger INVENTORS
Tomohiko Sada,
Noriyuki Tsuchiya, Tameo Amamiya,
BY Yoko Kanda and Kazuyuki Ohta Lewis H. Eslinger INVENTORS
Tomohiko Sada, Noriyuki Tsuchiya
Tameo Amamiya, Yoko Kaneda and
BY Kazuyuki Ohta Lewis H. Eslinger INVENTOR.
Tomohiko Sada, Noriyuki Tsuchiya, Tameo Amamiya, Yoko Kaneda and
BY Kazuyuki Ohta
Lewis H. Eslinger

PRINTED CIRCUIT BOARD HAVING A THERMALLY INSULATED RESISTOR

BACKGROUND OF THE INVENTION

1. Field of the Invention

This invention relates to printed circuit boards and particularly to means for insulating printed resistors from the effects of heat so that they can be placed on the surface of the board that comes into contact with molten solder.

2. Prior Art

Heretofore, printed circuit boards have had a conductive circuit pattern formed on one surface. If such boards also included resistors formed by printing process, such resistors were located on the other surface of the board to be isolated from the heat of the molten solder bath used to connect different sections of the conductive path and to connect discrete components such as resistors, capacitors, coils, etc. to the conductive circuit. In order to connect printed circuits on one side of the board with printed resistors on the other side of the board it has heretofore been the practice to plate conductive coating through holes in the board. Such plated-through holes are difficult to make and require special care in the plating process. In addition, it is necessary to align the board so that it can be printed on both sides, with the conductive circuit portions on one side making proper connection via the plated-through holes with conductive circuit sections on the other side.

It would be desirable to put the printed resistors on the same side of the board as the conductive circuit sections but the heat of the molten solder bath has a deleterious effect on the resistors. For example, the heat may change the resistance values substantially so that they do not conform with the proper design value.

Accordingly, it is an object of the present invention to provide a printed circuit board having printed resistors on the same surface as the conductive wiring sections.

Another object is to provide an insulating layer directly over the printed resistors to protect them from the adverse effects of molten solder.

A further object of the present invention is to provide additional means for insulating the contact areas of the resistors from direct heat flow through the conductive circuit sections but without interfering with the flow of electric current through the resistors.

Still further objects will be apparent from the following specification and drawings.

BRIEF DESCRIPTION OF THE INVENTION

The present invention includes a printed circuit board with conductive circuit sections on one surface and a printed resistor on the same surface. The resistor has terminal areas that make electrical connection with printed circuit sections and the resistor is covered with a heat insulating layer. Preferably, the heat insulating layer extends beyond the perimeter of the resistor sufficiently to prevent not only the surface of the resistor but its edges from receiving excessive heat flow from the molten solder when the board is in contact therewith to make the necessary mechanical and electrical connections.

In a modified form of the invention, contact terminals of the resistors are connected by printed contact layers of material having good electrical conductivity but relatively poor heat conductivity, and the entire resistor and additional contact layers are coated with heat insulating material that extends not only beyond the perimeter of the resistor but also beyond the perimeter of the contact layers.

BRIEF DESCRIPTION OF THE DRAWINGS

The invention will be described in connection with the drawings, in which.

DETAILED DESCRIPTION OF THE DRAWINGS

Figure 1A:
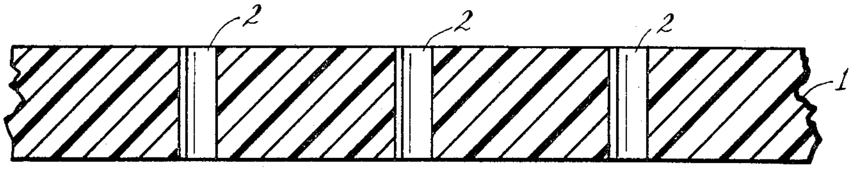
FIGS. 1A–H show a succession of steps of forming a printed circuit board with a heat insulating layer according to the invention.

In the manufacture of a printed circuit board according to the invention, a suitable insulating substrate 1 is shown in FIG. 1A. This substrate may be a paper-phenol board or a glass-epoxy board or any other insulating board or material suitable for use as a base for a printed circuit. The substrate 1 has a plurality of holes 2 extending through it to receive the terminal leads of electrical circuit components.

Figure 1B:
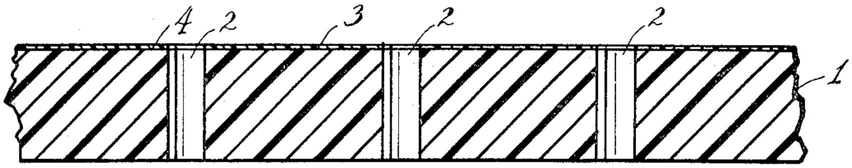

In FIG. 1B a layer 3 of a suitable adherent undercoat, such as an epoxy resin, is applied to one surface 4 of the substrate 1.

Figure 1C:
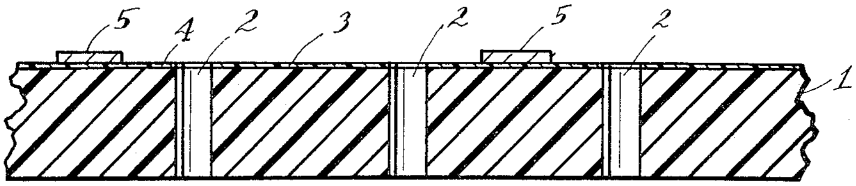

In FIG. 1C resistors 5 are printed by any suitable means, such as by applying a resistive paint at predetermined areas of the undercoat 3. In accordance with a standard technique for forming printed resistors on a printed circuit board, the resistive material may consist of a powder of carbon, metal oxide, and a synthetic resin as a binder. After the printed resistor has been applied to the layer 3, it is hardened by heat at a temperature of about 150 C.

Figure 1D:
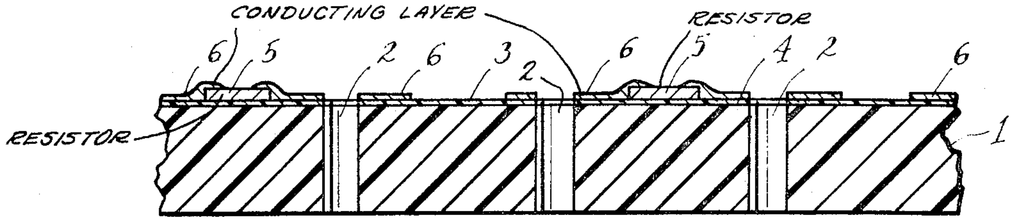
Figure 2:
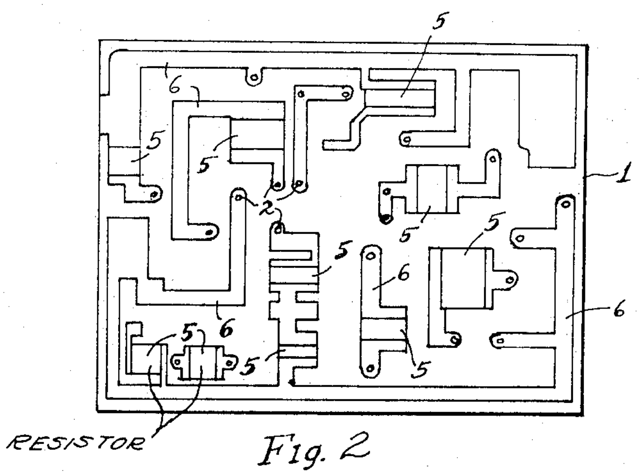
FIG. 2 shows the printed circuit surface of the board in FIG. 1.

As shown in FIG. 1D and in FIG. 2, conductive circuit sections 6 are formed at selective areas on top of the undercoat 3, and connector areas of certain of these conductive sections 6 extend over and make electrical contact with terminal edge portions of the resistor 5. The conductive circuit sections 6 may be, for example, copper foil or a conductive paint, such as a paint comprising about 85–90 percent silver powder, about 0.01–6 percent aluminum powder and about 9 percent epoxy resin (with phenol). It should be noted that the order of printing may be reversed and the resistors 5 may be printed after the circuit sections 6 so that they overlap the circuit sections instead of the other way around.

Figure 1E:
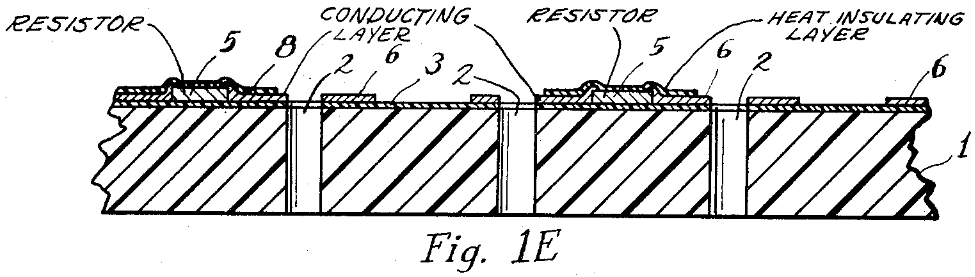
Figure 3:
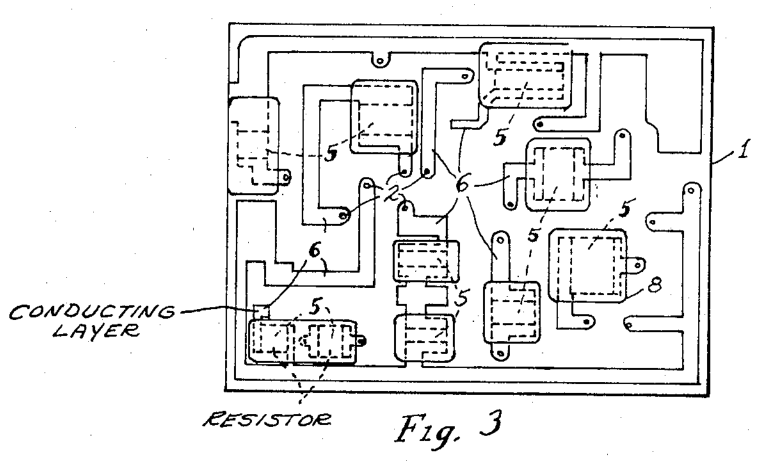
FIG. 3 shows the board in FIG. 2 with heat insulating layers on the resistors on such board.

The foregoing steps in the process of forming a printed circuit board are all in accordance with the prior art. In accordance with the present invention, FIG. 1E and FIG. 3 show a layer 8 of heat insulating material, such as epoxy resin, applied over the resistors 5 and over adjacent portions of the conductive circuit sections 6. The thickness of this heat insulating layer is preferably greater than about 10 microns.

Figure 1F:
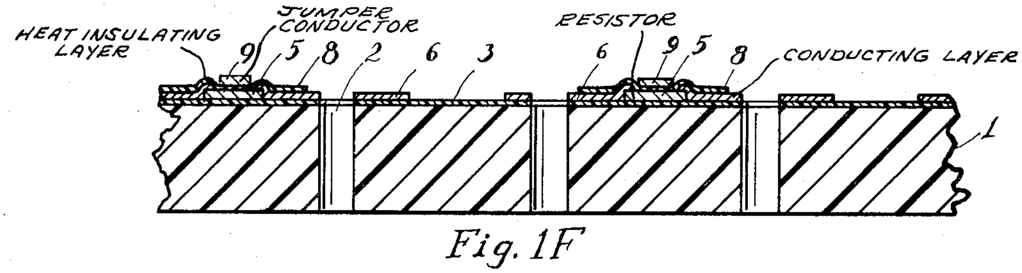
Figure 4:
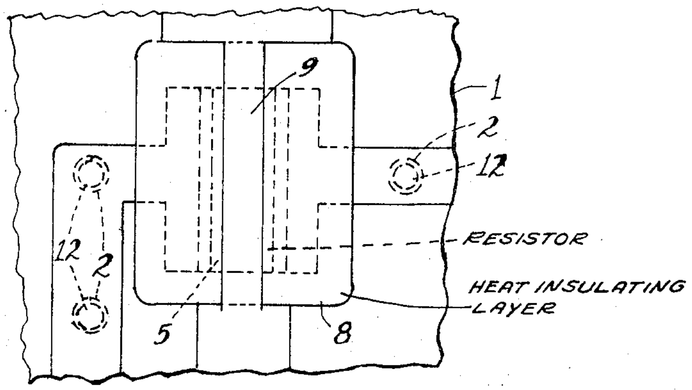
FIG. 4 shows an enlarged portion of the surface of the board in FIG. 3.

After the heat insulating layer 8 has been applied, a jumper circuit layer 9 may be applied thereover as shown in FIG. 1F and FIG. 4. This jumper layer is electrically separated from the resistor 5 by the heat insulating layer 8, which serves both as a heat insulator and as an electrical insulator. Thus it is possible to connect one part of the conductive circuit sections 6 to another part by means of the jumper 9 without the necessity of plating through any of the holes 2.

Figure 1G:
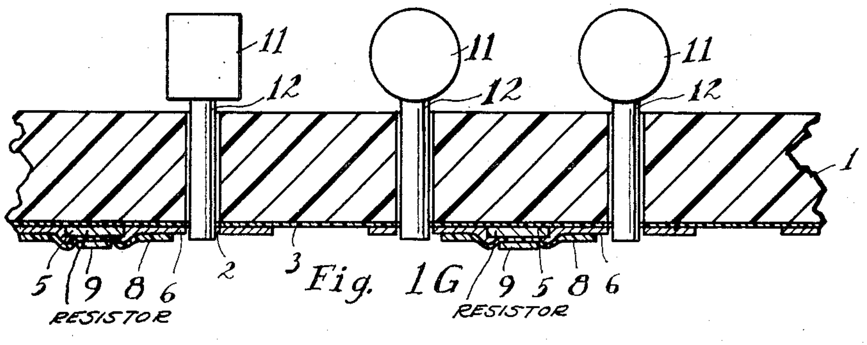

FIG. 1G shows the substrate 1 of the FIG. 1F inverted and with discrete electronic components, in this instance, two resistors 11, mounted thereon. The resistors 11 have terminal leads 12 that extend through the holes 2 in the substrate 1 and into close proximity to conductive circuit sections 6. The resistors 11 are only shown as illustrative of components that could be connected to the printed circuit conductive sections 6. Instead of these components, entirely different components such as coils, relays, solid-state devices, etc. could be connected into the circuit.

Figure 1H:
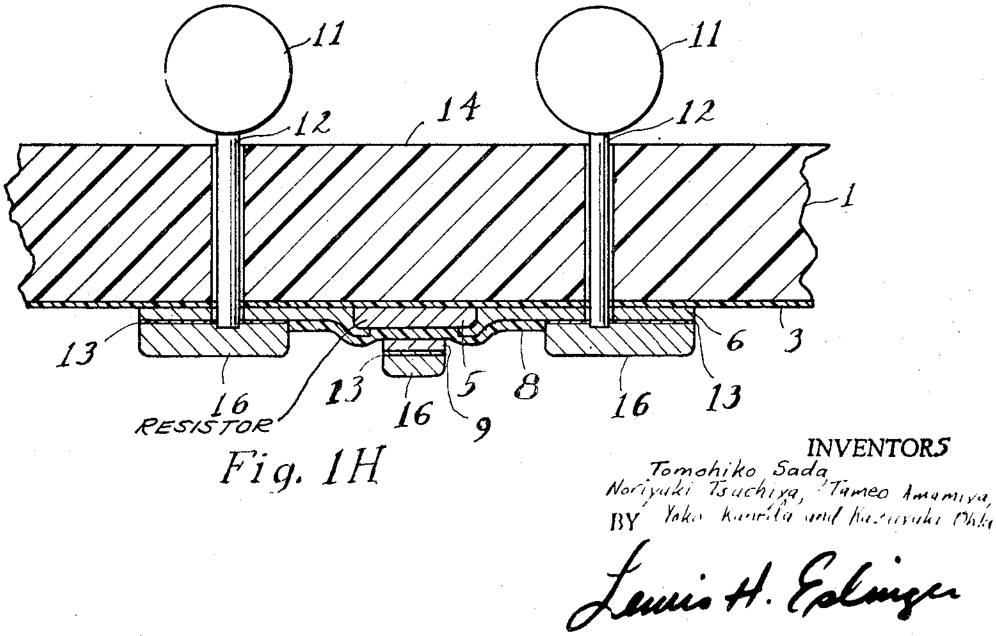

FIG. 1H shows an enlarged cross-sectional view of part of the circuit in FIG. 1G to illustrative some of the details more clearly. Jumper 9 may be formed of a conductive paint of the type described hereinabove, and the conductive circuit sections 6 may also be formed of the same material, although they can also be formed of copper foil having the proper configuration. A layer 13 of copper or silver can be plated thereover by an electroless process. The layer 13 is preferably an electroless layer of silver or copper and may serve more than one purpose. For one thing, it facilitates later adherence of solder to the conductive circuit sections 6 and the jumper 9. For another thing, it may increase the conductivity if the conductive circuit sections 6 and the jumper 9 are deficient in that quality.

In order to carry out the electroless plating, the material to be plated, for example the jumper 9, may include a reducing agent. Alternatively, the plating bath could have a reducing agent in it to promote the electroless plating process. Instead of using aluminum powder in the paint out of which the jumper 9 and perhaps the conductive circuit sections 6 may be formed, it is possible to substitute iron or copper. Both of these substances would promote the electroless plating and either iron or copper would be a suitable reducing agent for silver.

After the layer 13 has been added to the jumper 9 and the conductor sections 6, the discrete components, such as resistors 11, are attached to the substrate 1. As noted, the resistors 11 are located on the opposite side 14 of the substrate 1 from the side on which the conductive circuit sections 6 and the resistor 5 are located. In order to attach the resistors 11 firmly to the circuit sections 6, the surface of the substrate 1 on which these circuit sections 6 are located is inserted into molten solder. The solder may be any type of well known solder bath and may include a substantially flat motionless surface or a surface on which a wave is generated to bring a raised section of the molten solder up into contact with the printed sections of the conductive circuit sections 6. As a result of the soldering operation, the solder accumulates and solidifies as indicated by reference numeral 16 to attach the terminal leads 13 to the conductive circuit sections 6. The layer 13 facilitates wetting of the conductive circuit sections 6 and the jumper 9 by the molten solder.

Figure 5:
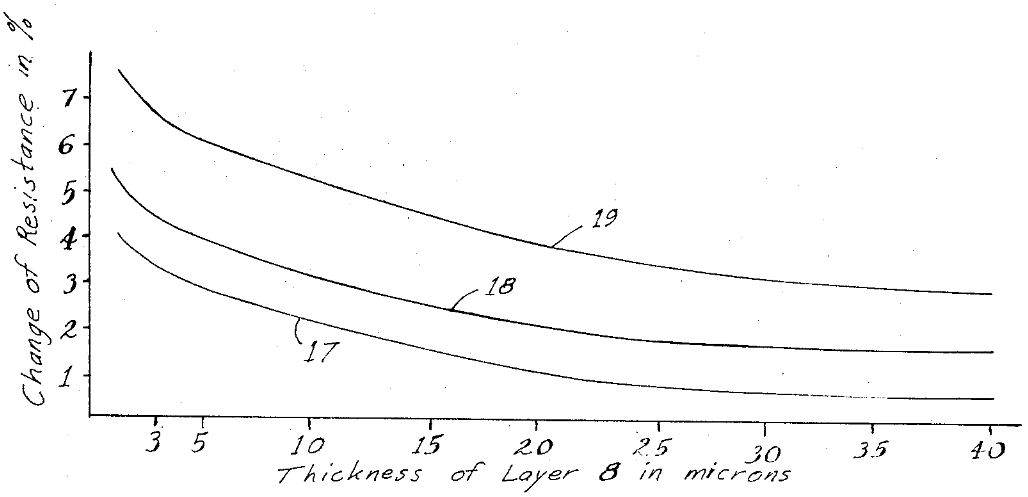
FIG. 5 is a graph showing the relationship between the thickness of the heat insulating layer and the change of resistance.

FIG. 5 is a graph illustrating the relationship between the thickness of the layers 8 and the change of resistance of the resistors 5 as a percentage of the initial value of resistance before the soldering operation. Of the curves shown in FIG. 5, the lower curve 17 represents the percent change of resistance if the printed circuit board is held in a molten solder bath for a period of 5 seconds. The intermediate curve 18 shows the change of resistance resulting from holding the printed resistor 5 in the molten solder for a period of 10 seconds. The uppermost curve 19 shows the change in resistance that results from holding the printed resistor in a molten solder bath for 20 seconds.

Inspection of FIG. 5 shows that the resistor can be held in molten solder longer without excessive change of its resistance if the thickness of the heat insulating layer 8 is great enough. If the change in resistance is to be no greater than 5 percent, the thickness of the layer 8 must be at least approximately 17 microns if the resistor is held in the solder bath for as long as 20 seconds. However, if the resistor is held in the solder bath no more than 10 seconds, the resistance value will not change more than 5 percent if the layer 8 is only about 2 microns thick. The change is even less if the resistor is held in the solder bath for 5 seconds, but this point is actually off the graph.

Figure 6:
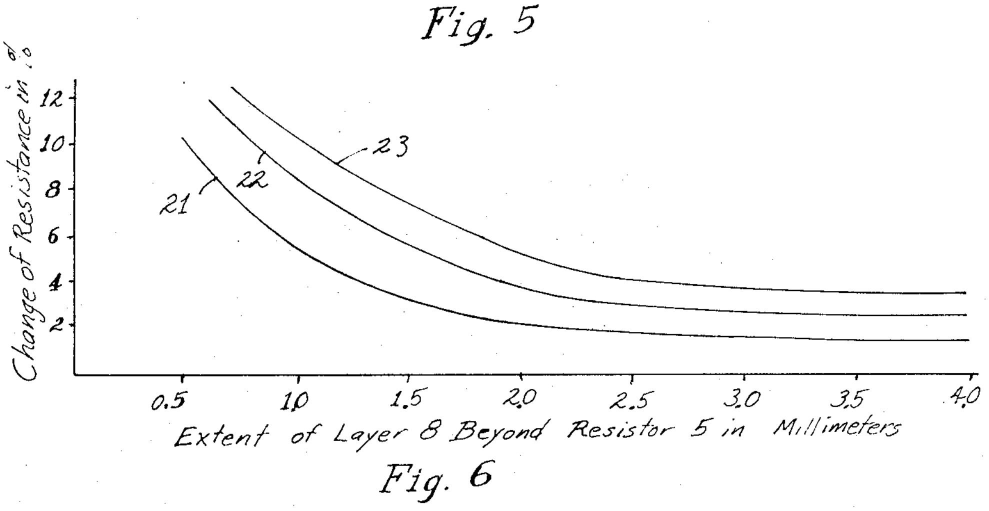
FIG. 6 is a graph showing the relationship between the extent of overlap of the heat insulating layer and the change of resistance.

FIG. 6 is another series of curves based on a heat insulating layer 8 that is 40 microns thick and showing the increase in heat protection due to extending the layer 8 beyond the boundary of the resistor. As may be seen by examination of curve 21, if the change of resistance is to be limited to a maximum of 5 percent and if the heat insulating layer 8 extends only about 1.1 mm. beyond the boundary of the resistors 5, the resistor must be held in the solder bath no longer than 5 seconds. However, curve 22 shows that if the layer 8 extends about 1.7 mm. beyond the resistor 5, the resistor can be held in the solder bath about 10 seconds, and curve 23 shows that if the layer 8 extends about 2.4 mm. beyond the resistor 5, the resistor can be held in the solder bath for 20 seconds.

Figure 7:
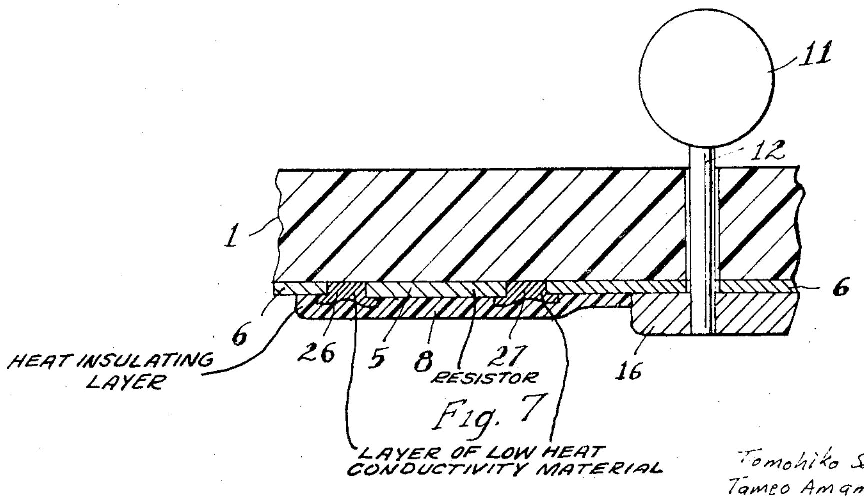
FIG. 7 shows a modified printed circuit board with additional heat insulating connection layers.

FIG. 7 shows a cross-sectional view of a printed circuit based on the substrate 1 and having conductive circuit sections 6 affixed thereto as in the embodiment in FIGS. 1A–H. The resistor 5 is also formed on the same surface as the conductive circuit sections 6, but between the connector areas of the conductive circuit sections 6 and the terminal edge portions of the resistor 5 are two additional layers 26 and 27 of material that has a relatively high electrical conductivity and relatively low heat conductivity. The material of which the layers 26 and 27 is made may consist of silver powder mixed with carbon powder and an epoxy resin binder. The heat insulating layer 8 is applied not only over the resistor 5 but also over the layers 26 and 27 and the combined effect of the layer 8 and the layers 26 and 27 is to isolate the resistor 5 to a much greater degree from the effects of heat.

What is claimed is:

1. A printed circuit comprising: an insulating substrate; first and second conductive circuit sections formed on the surface of said substrate; at least one resistor formed on said surface and comprising first and second terminal areas; first and second layers of electrically conductive material having lower heat conductivity than said first and second conductive circuit sections, said first layer being connected in series between said first conductive circuit section and said first terminal area, and said second layer being connected between said second conductive circuit section and said second terminal area; and a heat insulating layer formed at least on said resistor.

2. The printed circuit of claim 1 in which said heat insulating layer extends completely over said resistor and said first and second layers of electrically conductive material.

* * * * *